(12) United States Patent
Lee et al.

(10) Patent No.: US 9,953,943 B2
(45) Date of Patent: Apr. 24, 2018

(54) SEMICONDUCTOR APPARATUS HAVING MULTIPLE RANKS WITH NOISE ELIMINATION

(71) Applicant: SK hynix Inc., Icheon-si, Gyeonggi-do (KR)

(72) Inventors: Dong Uk Lee, Icheon-si (KR); Kyung Whan Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/137,269

(22) Filed: Apr. 25, 2016

(65) Prior Publication Data

US 2017/0162237 A1    Jun. 8, 2017

(30) Foreign Application Priority Data

Dec. 2, 2015    (KR) .................. 10-2015-0170502

(51) Int. Cl.

| | | |
|---|---|---|
| *G11C 5/02* | (2006.01) | |
| *H01L 23/00* | (2006.01) | |
| *H01L 25/065* | (2006.01) | |
| *H01L 25/18* | (2006.01) | |
| *G11C 5/04* | (2006.01) | |
| *G11C 5/06* | (2006.01) | |
| *G11C 7/02* | (2006.01) | |
| *G11C 7/10* | (2006.01) | |
| *G11C 7/22* | (2006.01) | |

(52) U.S. Cl.
CPC ............... *H01L 24/17* (2013.01); *G11C 5/04* (2013.01); *G11C 5/063* (2013.01); *G11C 7/02* (2013.01); *G11C 7/106* (2013.01); *G11C 7/1006* (2013.01); *G11C 7/1042* (2013.01); *G11C 7/1066* (2013.01); *G11C 7/1069* (2013.01); *G11C 7/222* (2013.01); *H01L 25/0657* (2013.01); *H01L 25/18* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01); *H01L 2924/1426* (2013.01); *H01L 2924/1432* (2013.01); *H01L 2924/1434* (2013.01)

(58) Field of Classification Search
CPC ........... G11C 7/12; G11C 7/1078; G11C 7/22; G11C 7/1051; G11C 8/08; G11C 5/025; H01L 24/17; H01L 25/0657; H01L 25/18; H01L 2225/06517; H01L 2924/1434; H01L 2924/1432; H01L 2224/16227; H01L 2924/142
USPC .......................................................... 365/51
See application file for complete search history.

(56) References Cited

U.S. PATENT DOCUMENTS

| | | | |
|---|---|---|---|
| 8,369,160 B2 | 2/2013 | Kim | |
| 9,432,298 B1* | 8/2016 | Smith | ................. H04L 49/9057 |
| 2013/0036273 A1* | 2/2013 | Shaeffer | ................. G06F 13/16 |
| | | | 711/148 |

\* cited by examiner

*Primary Examiner* — Thao H Bui

(74) *Attorney, Agent, or Firm* — William Park & Associates Ltd.

(57) ABSTRACT

A semiconductor apparatus includes a plurality of dies. Any one of the dies may be set to a first rank and another of the dies may be set to a second rank. One or more of the first and second ranks may be configured to output any one of an even-numbered byte and an odd-numbered byte through an input/output stage at a timing earlier than the other one, according to a read command.

17 Claims, 7 Drawing Sheets

SEMICONDUCTOR APPARATUS HAVING MULTIPLE RANKS WITH NOISE ELIMINATION

CROSS-REFERENCES TO RELATED APPLICATION

The present application claims priority under 35 U.S.C. § 119(a) to Korean application number 10-2015-0170502 filed on Dec. 2, 2015, in the Korean Intellectual Property Office, which is incorporated herein by reference in its entirety.

BACKGROUND

1. Technical Field

Various embodiments generally relate to a semiconductor circuit, and more particularly to a semiconductor apparatus having multiple ranks.

2. Related Art

A semiconductor apparatus having a three-dimensional (3D) structure may be manufactured by forming vertical transistor structures. Alternatively, a semiconductor apparatus having the 3D structure may be manufactured by stacking semiconductor dies and interconnecting them vertically to minimize the space required to build structures.

A system on chip (SOC) semiconductor apparatus is an integrated circuit that integrates a semiconductor memory and a memory controller such as CPU or GPU for controlling the semiconductor memory into a single chip, whereas in a case of a system in package, the semiconductor memory and the memory controller are assembled inside a single package.

When multiple driver circuits switch simultaneously in the semiconductor apparatus having multiple ranks such as the 3D structure semiconductor apparatus, a noise may be induced. For example, Simultaneous Switching Noise (SSN) may occur. The noise may deteriorate the performance of the driver circuits.

SUMMARY

In an embodiment of the present disclosure, a semiconductor apparatus may include a plurality of dies. Any one of the stacked dies may be set to a first rank and another of the stacked dies may be set to a second rank. One or more of the first and second ranks may be configured to output any one of an even-numbered byte and an odd-numbered byte through an input/output stage at a timing earlier than the other one, according to a read command.

In an embodiment of the present disclosure, a semiconductor apparatus may include first and second dies. An input/output stage of the first die set to a first rank may be coupled to an input/output stage of the second die set to a second rank. One or more of the first and second ranks may be configured to sequentially output even-numbered bytes and odd-numbered bytes through the input/output stages according to a read command, and output any one of the even-numbered byte and the odd-numbered byte corresponding to the earliest in order among the even-numbered bytes and the odd-numbered bytes through the input/output stage at a timing earlier than the other one.

In an embodiment of the present disclosure, a semiconductor apparatus may include a cell array, a DBI circuit, a first driver, a second driver, and a preset signal generation circuit. The cell array may output data according to a read command. The DBI circuit may generate DBI data and DBI flags by performing a DBI operation on the data output from the cell array, may output the DBI data and the DBI flags, and may be reset according to a DBI reset signal. The first driver may drive an even-numbered byte among the DBI data to a first input/output stage at a first timing. The second driver may drive an odd-numbered byte among the DBI data to a second input/output stage at a timing earlier than the first timing, according to a preset signal. The preset signal generation circuit may generate the preset signal according to the DBI reset signal.

BRIEF DESCRIPTION OF THE DRAWINGS

Features, aspects, and embodiments are described in conjunction with the attached drawings, in which.

DETAILED DESCRIPTION

Hereinafter, a stack-type semiconductor apparatus according to various embodiments of the present disclosure will be described below with reference to the accompanying drawings.

Figure 1:
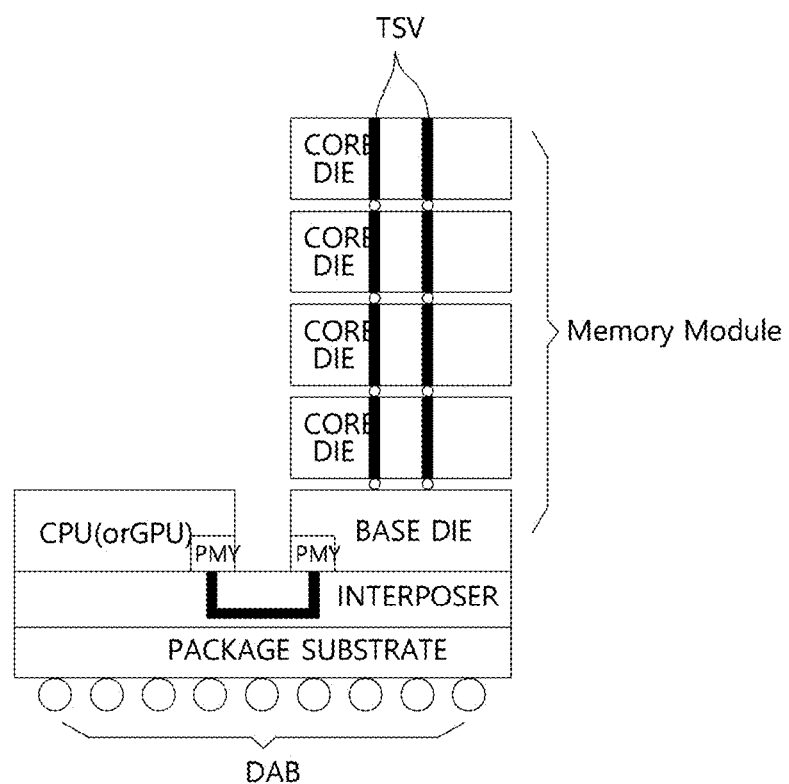
FIG. 1 is a diagram illustrating an example of a semiconductor system 10 according to an embodiment of the present disclosure.

As illustrated in FIG. 1, a semiconductor system 10 according to an embodiment of the present disclosure may have an SOC structure.

The semiconductor system 10 according to an embodiment of the present disclosure may include a memory module, a memory controller (e.g., CPU or GPU), an interposer, a package substrate, and a plurality of test input terminals.

The plurality of test input terminals may include Direct Access Balls (DABs).

The interposer may be disposed over the package substrate.

The memory module and the memory controller may be disposed over the interposer.

The physical regions PHY of the memory module and the memory controller (e.g., CPU or GPU) may be coupled to each other through the interposer. For example, the physical regions PHY of the memory module and the memory controller (e.g., CPU or GPU) may be coupled to each other through a certain conductive material formed in the interposer.

The memory module may include therein a plurality of dies stacked on top of each other.

The plurality of dies may include a base die formed at the lowermost level and a plurality of core dies stacked over the base die.

The base die and the plurality of core dies may be electrically coupled through through-hole electrodes, for example, Through Silicon Vias (TSVs), and may transmit data, command, and address signals.

FIG. 1 illustrates only one memory module. In an actual circuit configuration, however, a plurality of memory modules may be coupled to the memory controller (e.g., CPU or GPU) through the interposer.

The package substrate may include a plurality of DABs formed on an outer surface thereof.

The plurality of DABs may be electrically coupled to the memory module through the package substrate and the interposer.

Through the DABs, a host system (not illustrated) may directly access the memory module from outside the semiconductor system 10 to perform a test or the like.

Figure 2:
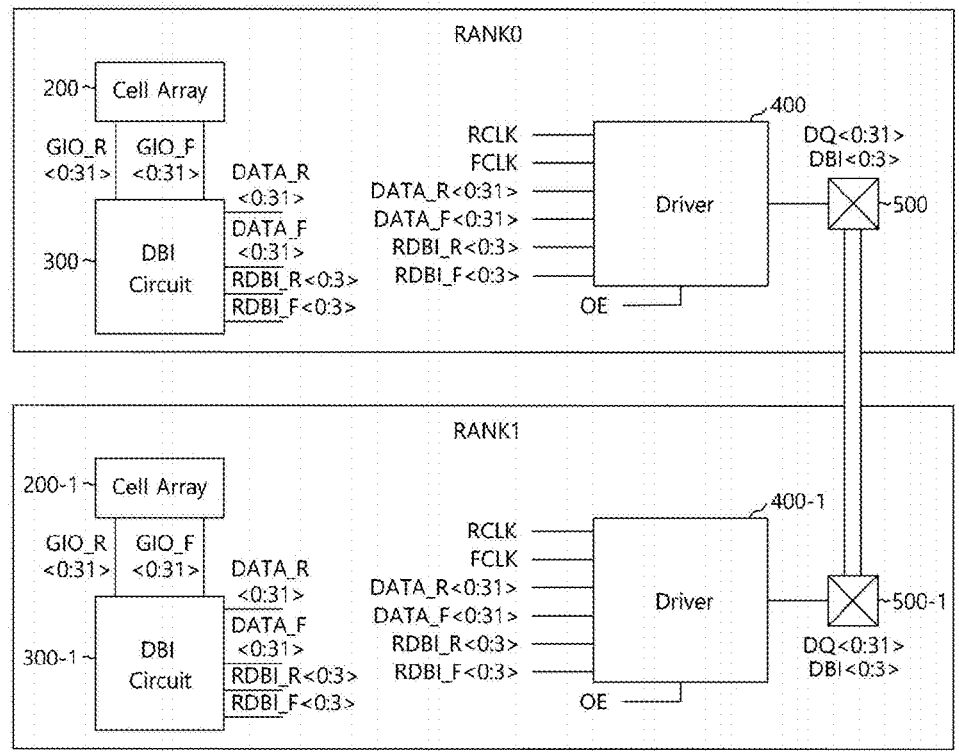
FIG. 2 is a diagram illustrating an example of a semiconductor apparatus 100 according to an embodiment of the present disclosure.

As illustrated in FIG. 2, the semiconductor apparatus 100 according to an embodiment of the present disclosure may correspond to the memory module of FIG. 1. FIG. 2 illustrates two core dies among the dies included in the memory module of FIG. 1.

Each of the two core dies may have a rank structure. For convenience purposes only, the core dies will be referred to as first and second ranks RANK0 and RANK1.

An input/output stage 500 of the first rank RANK0 may be coupled to an input/output stage 500-1 of the second rank RANK1.

The first and second ranks RANK0 and RANK1 may be configured in the same manner.

The first rank RANK0 may include a cell array 200, a Data Bus Inversion (DBI) circuit 300, a driver 400, and an input/output stage 500.

The cell array 200 may output data GIO_R<0:31> and GIO_F<0:31> according to an address and command provided from a component disposed outside the memory module (e.g., the memory controller of FIG. 1) or a component disposed outside the package (e.g., the host system).

The DBI circuit 300 may perform a DBI operation on the data GIO_R<0:31> and GIO_F<0:31> output from the cell array 200, and generate DBI data DATA_R<0:31> and DATA_F<0:31> and DBI flags RDBI_R<0:3> and RDBI_F<0:3>.

Here, the DBI operation may include a technology that inverts bits in a current set of data if, by doing that, a number of transitions becomes smaller than that of a previous set of data.

The DBI data DATA_R<0:31> and DATA_F<0:31> may be obtained by performing the DBI operation on the data GIO_R<0:31> and GIO_F<0:31> output from the cell array 200.

The DBI flags RDBI_R<0:3> and RDBI_F<0:3> may define whether the DBI data DATA_R<0:31> and DATA_F<0:31> are data obtained by inverting the data GIO_R<0:31> and GIO_F<0:31> output from the cell array 200.

The driver 400 may drive the DBI data DATA_R<0:31> and DATA_F<0:31> and the DBI flags RDBI_R<0:3> and RDBI_F<0:3> to the input/output stage 500 according to first and second synchronous clock signals RCLK and FCLK and an output enable signal OE.

The output enable signal OE may be provided to define a data output period according to a command and preset latency.

The input/output stage 500 may include data input/output pads DQ<0:31> and DBI pads DBI<0:3>.

The second rank RANK1 may include a cell array 200-1, a DBI circuit 300-1, a driver 400-1, and an input/output stage 500-1. Since the second rank RANK1 may be configured in the same manner as the first rank RANK0, any repetitive detailed description will be omitted or simplified in order to avoid complication.

Figure 3:
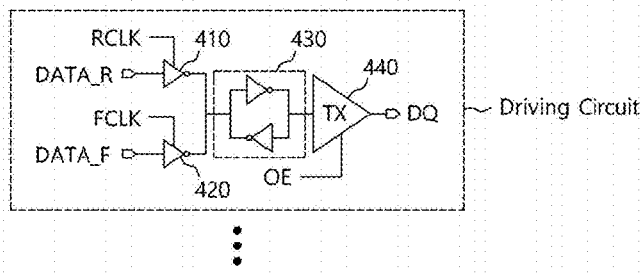
FIG. 3 is a diagram illustrating an example of a driver 400 according to an embodiment of the present invention.

As illustrated in FIG. 3, the driver 400 may include a plurality of driving circuits.

Each of the driving circuit may temporarily store one bit of the DBI data DATA_R<0:31> and one bit of the DBI data DATA_F<0:31> according to the first and second synchronous clock signals RCLK and FCLK, respectively, and drive the latched signal to one of the data input/output pads DQ<0:31> of the input/output stage 500 according to the output enable signal OE.

In an embodiment, the driving circuit may include first and second logic gates 410 and 420, a latch 430, and a transmitter 440.

The first logic gate 410 may invert one bit of multiple bits of the DBI data DATA_R<0:31> according to the first synchronous clock signal RCLK.

The second logic gate 420 may invert one bit of multiple bits of the DBI data DATA_F<0:31> according to the second synchronous clock signal FCLK.

The latch 430 may store output signals of the first and second logic gates 410 and 420.

The transmitter 440 may drive the signal stored in the latch 430 to one of the data input/output pads DQ<0:31> of the input/output stage 500 during an active period of the output enable signal OE.

Although not illustrated in FIG. 3, the driver 400 may further include driving circuits for driving the DBI flags RDBI_R<0:3> and RDBI_F<0:3> to the DBI pads DBI<0:3> of the input/output stage 500.

An example of the data output operation of the semiconductor apparatus 100 of FIG. 2 can be described as follows.

Figure 4:
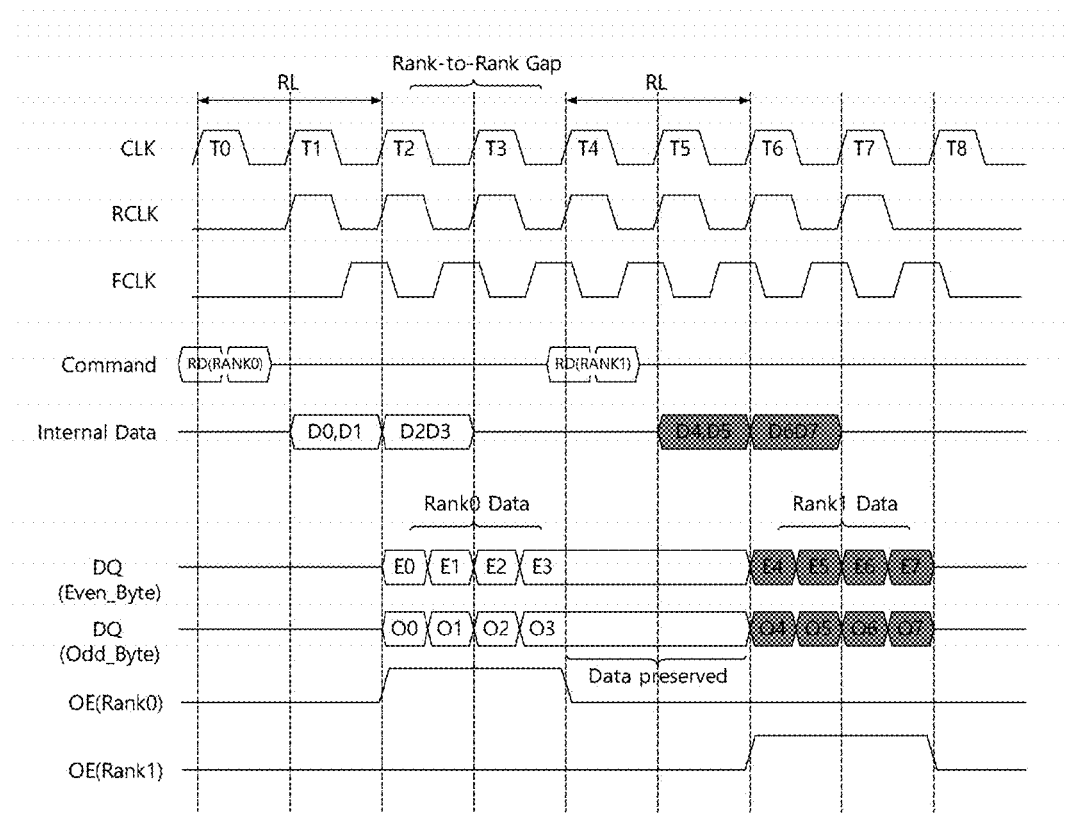
FIG. 4 is a timing diagram illustrating an example operation of the semiconductor apparatus 100 according to an embodiment of the present disclosure.

FIG. 4 illustrates an example in which Read Latency (RL) is set to 2tCK and Burst Length (BL) is set to 4.

When a read command RD for the first rank RANK0 is input at a timing T0 based on a rising edge of the clock signal CLK, internal data D0 to D3 may be output according to the first and second synchronous clock signals RCLK and FCLK based on a timing T1.

The first and second synchronous clock signals RCLK and FCLK may be synchronized with rising and falling edges of the clock signal CLK, respectively.

Based on the timing T2 corresponding to a timing when a latency time of the preset read latency RL has passed after an input of the read command RD for the first rank RANK0, data may be output through the input/output pads DQ<0:31> according to the output enable signal OE.

When it is assumed that a predefined rank-to-rank gap is 2tCK, a read command RD for the second rank RANK1 may be input at a timing T4, and internal data D4 to D7 may be output according to the first and second synchronous clock signals RCLK and FCLK based on a timing T5.

Based on a timing T6 corresponding to a timing when a latency time of the preset read latency RL has passed after an input of the read command RD for the second rank RANK1, data may be output through the data input/output pads DQ<0:31> according to the output enable signal OE.

Here, the data input/output pads DQ<0:31> may be divided into even-numbered-byte pads and odd-numbered-byte pads on a byte basis.

For example, among the data input/output pads DQ<0:31>, the data input/output pads DQ<0:7> and DQ<16:23> may be set to even-numbered-byte pads, and the data input/output pads DQ<8:15> and DQ<24:31> may be set to odd-numbered-byte pads.

Thus, data output through the even-numbered-byte pads DQ<0:7, 16:23> among the data input/output pads DQ<0:31> of the first and second ranks RANK0 and RANK1 may be referred to as an even-numbered byte, and data output through the odd-numbered-byte pads DQ<8:15, 24:31> may be referred to as an odd-numbered byte.

For example, data E0 output through the even-numbered-byte pads DQ<0:7, 16:23> based on the first synchronous clock signal RCLK of the timing T2 may correspond to an even-numbered byte. Then, data E1 output through the even-numbered-byte pads DQ<0:7, 16:23> based on the second synchronous clock signal FCLK of the timing T2 may correspond to the next even-numbered byte.

Furthermore, data O0 output through the odd-numbered-byte pads DQ<8:15, 24:31> based on the first synchronous clock signal RCLK of the timing T2 may correspond to an odd-numbered byte, and data O1 output through the odd-numbered-byte pads DQ<8:15, 24:31> based on the second synchronous clock signal FCLK of the timing T2 may correspond to the next odd-numbered byte.

A DBI operation for data E4 and O4 of the second rank RANK1 output at the timing T6 may be performed based on the previous data. Since the previous data E3 and O3 are output from a different die, that is, the first rank RANK0, a comparison operation may be difficult to perform.

Thus, during any one or both of the even-numbered-byte output operation through the even-numbered-byte pads DQ<0:7, 16:23> and the odd-numbered byte output operation through the odd-numbered-byte pads DQ<8:15, 24:31>, the data may simultaneously transition.

Figure 5:
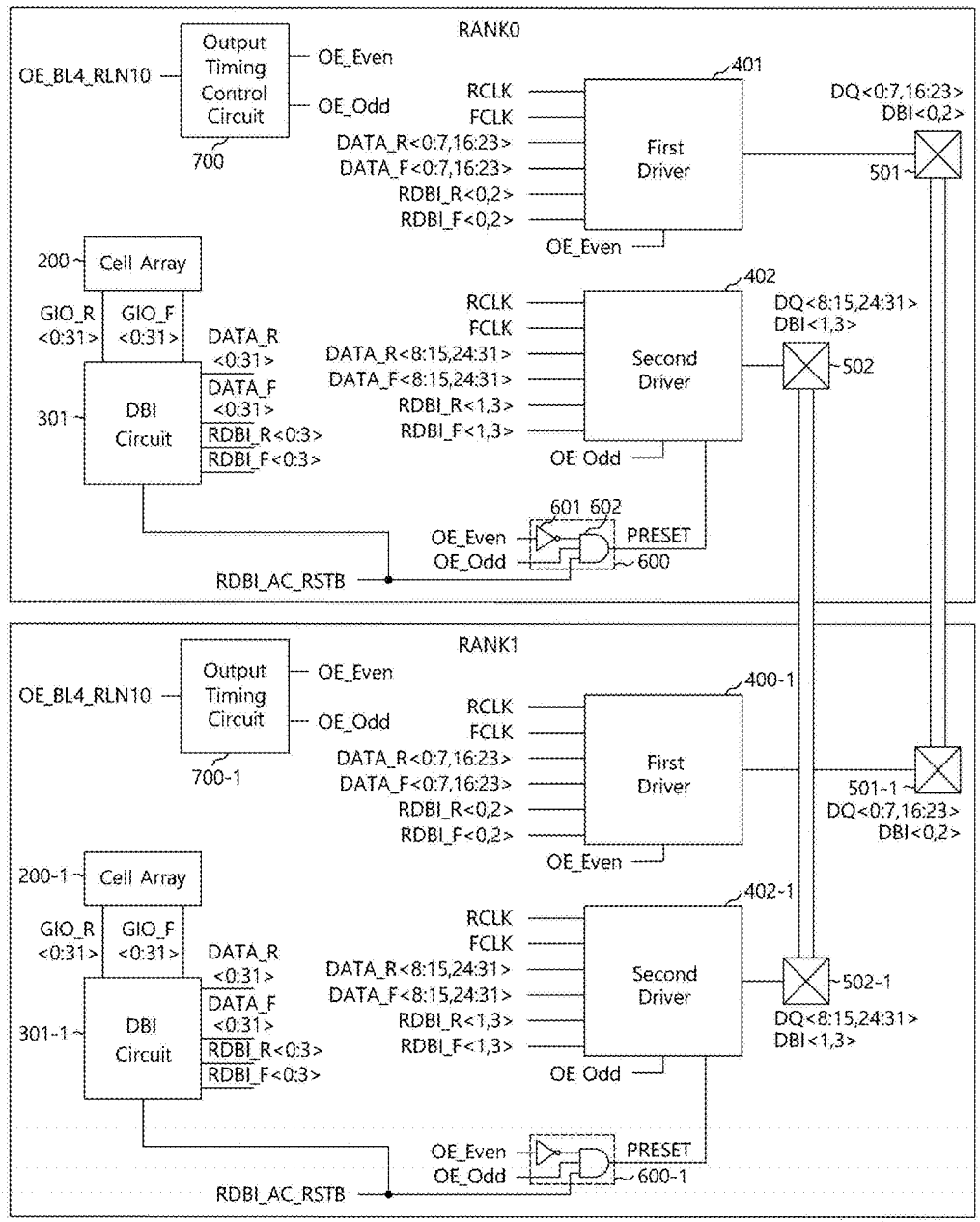
FIG. 5 is a diagram illustrating an example of a semiconductor apparatus 101 according to another embodiment of the present invention.

As illustrated in FIG. 5, a semiconductor apparatus 101 according to an embodiment of the present disclosure may correspond to the memory module of FIG. 1. FIG. 5 illustrates two core dies among the plurality of dies included in the memory module of FIG. 1.

Each of the two core dies may have a rank structure. For convenience purposes only, the core dies will be referred to as first and second ranks RANK0 and RANK1.

The first and second ranks RANK0 and RANK1 may be configured in the same manner.

The first rank RANK0 may include a cell array 200, a DBI circuit 301, a first driver 401, a second driver 402, a first input/output stage 501, a second input/output stage 502, a preset signal generation circuit 600, and an output timing control circuit 700.

The first and second input/output stages 501 and 502 of the first rank RANK0 may be coupled to the first and second input/output stages 501-1 and 502-1 of the second rank RANK1.

The first input/output stage 501 may include data input/output pads DQ<0:7, 16:23> corresponding to an even-numbered byte among data input/output pads DQ<0:31> and even-numbered DBI pads DBI<0, 2> among DBI pads DBI<0:3>.

The second input/output stage 502 may include data input/output pads DQ<8:15, 24:31> corresponding to an odd-numbered byte among the data input/output pads DQ<0:31> and odd-numbered DBI pads DBI<1, 3> among the DBI pads DBI<0:3>.

The cell array 200 may output data GIO_R<0:31> and GIO_F<0:31> according to an address and command provided from a component disposed outside the memory module (e.g., the memory controller of FIG. 1) or a component disposed outside the package (e.g., the host system).

The DBI circuit 301 may perform a DBI operation on the data GIO_R<0:31> and GIO_F<0:31> output from the cell array 200, and generate DBI data DATA_R<0:31> and DATA_F<0:31> and DBI flags RDBI_R<0:3> and RDBI_F<0:3>.

The DBI circuit 301 may perform a DBI operation only during a read operation period, and the DBI operation may be stopped according to a DBI reset signal RDBI_AC_RSTB at the other periods.

The first driver 401 may drive the DBI data DATA_R<0:7, 16:23> and DATA_F<0:7, 16:23> corresponding to an even-numbered byte among the DBI data DATA_R<0:31> and DATA_F<0:31> and the even-numbered DBI flags RDBI_R<0, 2> and RDBI_F<0, 2> among the DBI flags RDBI_R<0:3> and RDBI_F<0:3> to the first input/output stage 501 according to the first and second synchronous clock signals RCLK and FCLK and an even-numbered output enable signal OE_Even.

The second driver 402 may drive the DBI data DATA_R<8:15, 24:31> and DATA_F<8:15, 24:31> corresponding to an odd-numbered byte among the DBI data DATA_R<0:31> and DATA_F<0:31> and odd-numbered DBI flags RDBI_R<1, 3> and RDBI_F<1, 3> among the DBI flags RDBI_R<0:3> and RDBI_F<0:3> to the second input/output stage 502 according to the first and second synchronous clock signals RCLK and FCLK, an odd-numbered output enable signal OE_Even, and a preset signal PRESET.

The preset signal generation circuit 600 may generate the preset signal PRESET according to the even-numbered output enable signal OE_Even, the odd-numbered output enable signal OE_Odd, and the DBI reset signal RDBI_AC_RSTB.

The preset signal generation circuit 600 may include a first logic gate 601 and a second logic gate 602.

The first logic gate 601 may invert the even-numbered output enable signal OE_Even.

The second logic gate 602 may perform an AND operation on an output signal of the first logic gate 601, the odd-numbered output enable signal OE_Odd, and the DBI reset signal RDBI_AC_RSTB, and output the operation result as the preset signal PRESET.

The output timing control circuit 700 may generate the even-numbered output enable signal OE_Even and the odd-numbered output enable signal OE_Odd using a pre-output enable signal OE_BL4_RLN10.

The pre-output enable signal OE_BL4_RLN10 may correspond to one of internal shift signals of a circuit (hereafter, referred to as "OE circuit") which generates the output enable signal OE of FIG. 2.

The OE circuit may be arranged in a peripheral circuit of the semiconductor apparatus 101, generate the internal shift signals by sequentially shifting a source signal (e.g., command signal) based on the clock signal CLK, and output a signal corresponding to preset latency, among the internal shift signals, as the output enable signal OE of FIG. 2.

Thus, in an embodiment, one of the internal shift signals of the OE circuit may be used as the pre-output enable signal OE_BL4_RLN10.

The second rank RANK1 may include a cell array 200-1, a DBI circuit 301-1, a first driver 401-1, a second driver 402-2, a first input/output stage 501-1, a second input/output stage 502-1, a preset signal generation circuit 600-1, and an output timing control circuit 700-1. Since the second rank RANK1 may be configured in the same manner as the first rank RANK0, any repetitive detailed description will be omitted or simplified in order to avoid complication.

In the rank structure in which data are sequentially output from two different dies of which the input/output stages are coupled to each other, the semiconductor apparatus 101 according to an embodiment of the present disclosure may drive any one of an even-numbered byte and an odd-numbered byte in each of the first rank RANK0 and/or the second rank RANK1 to the input/output stage before the other one in order to prevent SSN. Although FIG. 5 illustrates only an example of the circuit configuration which drives the first odd-numbered byte before the first even-numbered byte, a circuit configuration that drives the first even-numbered byte before the first odd-numbered byte may also be included in the scope of the present invention.

Figure 6:
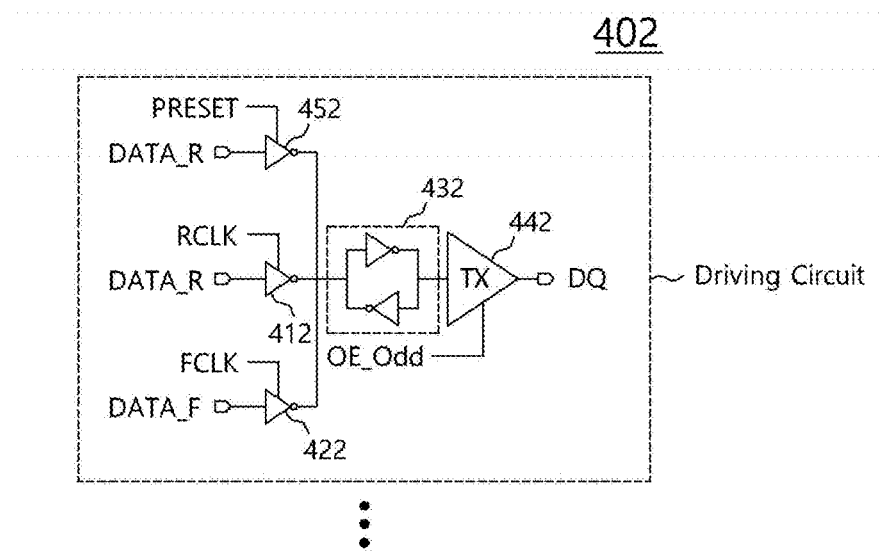
FIG. 6 is a diagram illustrating an example of a second driver 402 of FIG. 5.

As illustrated in FIG. 6, the second driver 402 may include a plurality of driving circuits.

Each of the driving circuits may include first to third logic gates 412, 422, and 452, a latch 432, and a transmitter 442.

The first logic gate 412 may invert one bit of the DBI data DATA_R<8:15, 24:31> according to the first synchronous clock signal RCLK.

The second logic gate 422 may invert one bit of the DBI data DATA_F<8:15, 24:31> according to the second synchronous clock signal FCLK.

The third logic gate 452 may invert one bit of the DBI data DATA_R<8:15, 24:31> according to the preset signal PRESET.

The latch 432 may store output signals of the first to third logic gates 412, 422, and 452.

The transmitter 442 may drive the signal stored in the latch 432 to one of the data input/output pads DQ<8:15, 24:31> of the second input/output stage 502 during an active period of the odd-numbered output enable signal OE_Odd.

Although not illustrated in FIG. 6, the second driver 402 may further include driving circuits for driving the odd-numbered DBI flags RDBI_R<1, 3> and RDBI_F<1, 3> to the DBI pads DBI<1, 3> of the second input/output stage 502.

Figure 7:
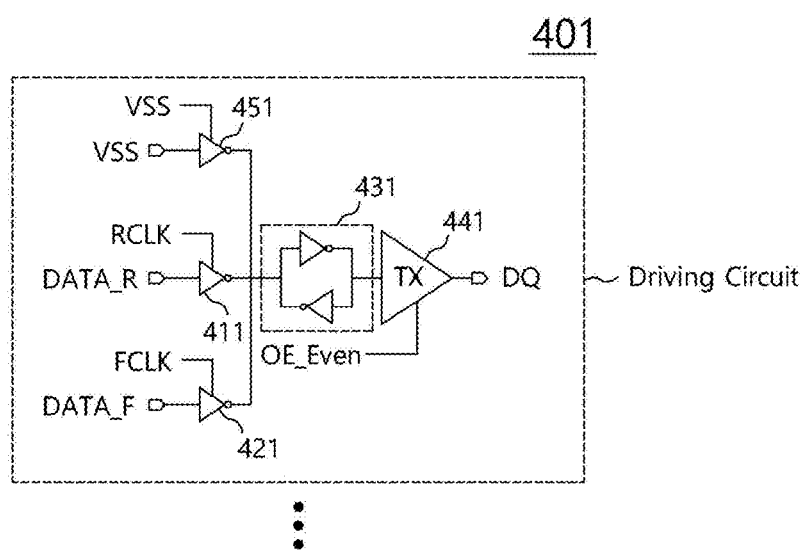
FIG. 7 is a diagram illustrating an example of a first driver 401 of FIG. 5

As illustrated in FIG. 7, the first driver 401 may include a plurality of driving circuits.

Each of the driving circuits may include first to third logic gates 411, 421, and 451, a latch 431, and a transmitter 441.

The first logic gate 411 may receive one bit of the DBI data DATA_R<0:7, 16:23> and invert the received bit, according to the first synchronous clock signal RCLK.

The second logic gate 421 may receive one bit of the DBI data DATA_F<0:7, 16:23> and invert the received bit, according to the second synchronous clock signal FCLK.

The third logic gate 451 is a dummy circuit for matching a timing margin of the second driver 402 with the third logic gate 451.

The latch 431 may store output signals of the first to third logic gates 411, 421, and 451.

The transmitter 441 may drive the signal stored in the latch 431 to one of the data input/output pads DQ<0:7, 16:23> of the first input/output stage 501 during an active period of the even-numbered output enable signal OE_Even.

Although not illustrated in FIG. 7, the driver 400 may further include driving circuits for driving the even-numbered DBI flags RDBI_R<0, 2> and RDBI_F<0, 2> to the DBI pads DBI<0, 2> of the first input/output stage 501.

Figure 8:
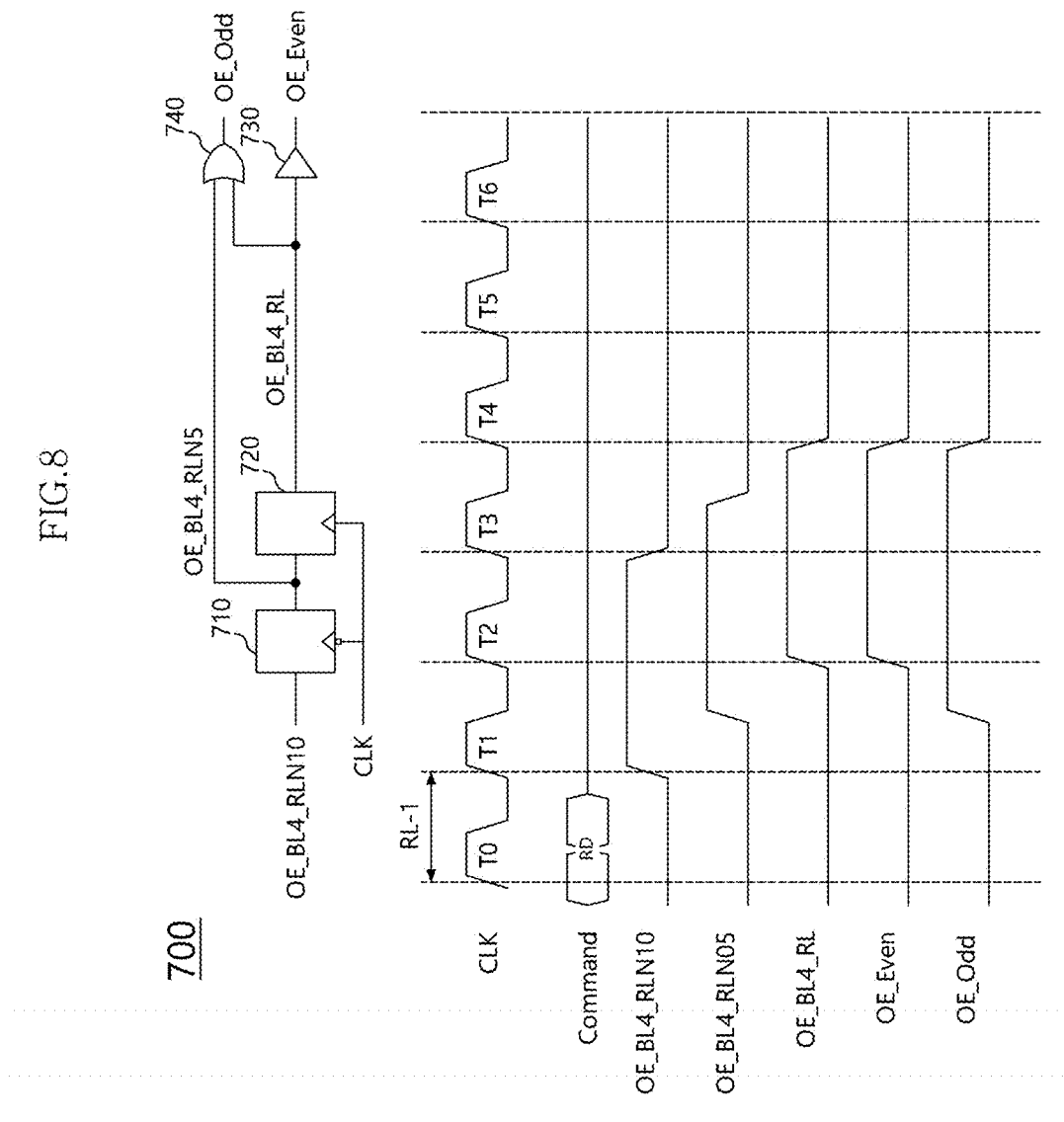
FIG. 8 is a diagram illustrating an example of an output timing control circuit 700 of FIG. 5.

As illustrated in FIG. 8, the output timing control circuit 700 may include first and second flip-flops 710 and 720 and first and second logic gates 730 and 740.

The first flip-flop 710 may temporarily store the pre-output enable signal OE_BL4_RLN10 at a timing RL−1 that is earlier by one clock (1tCK) than the read latency RL based on a read command RD, according to the clock signal CLK, and generate a first internal signal OE_BL4_RLN5 at a timing that is earlier by a half clock (0.5tCK) than the read latency RL.

The second flip-flop 720 may temporarily store the first internal signal OE_BL4_RLN5 according to the clock signal CLK, and generate a second internal signal OE_BL4_RL which coincides with the read latency RL.

The first logic gate 730 may buffer the second internal signal OE_BL4_RL, and output the buffered signals as the even-numbered output enable signal OE_Even.

The second logic gate 740 may perform an OR operation on the first internal signal OE_BL4_RLN5 and the second internal signal OE_BL4_RL, and output the operation result as the odd-numbered output enable signal OE_Odd.

The data output operation of the semiconductor apparatus 101 of FIG. 5 can be described as follows.

Figure 9:
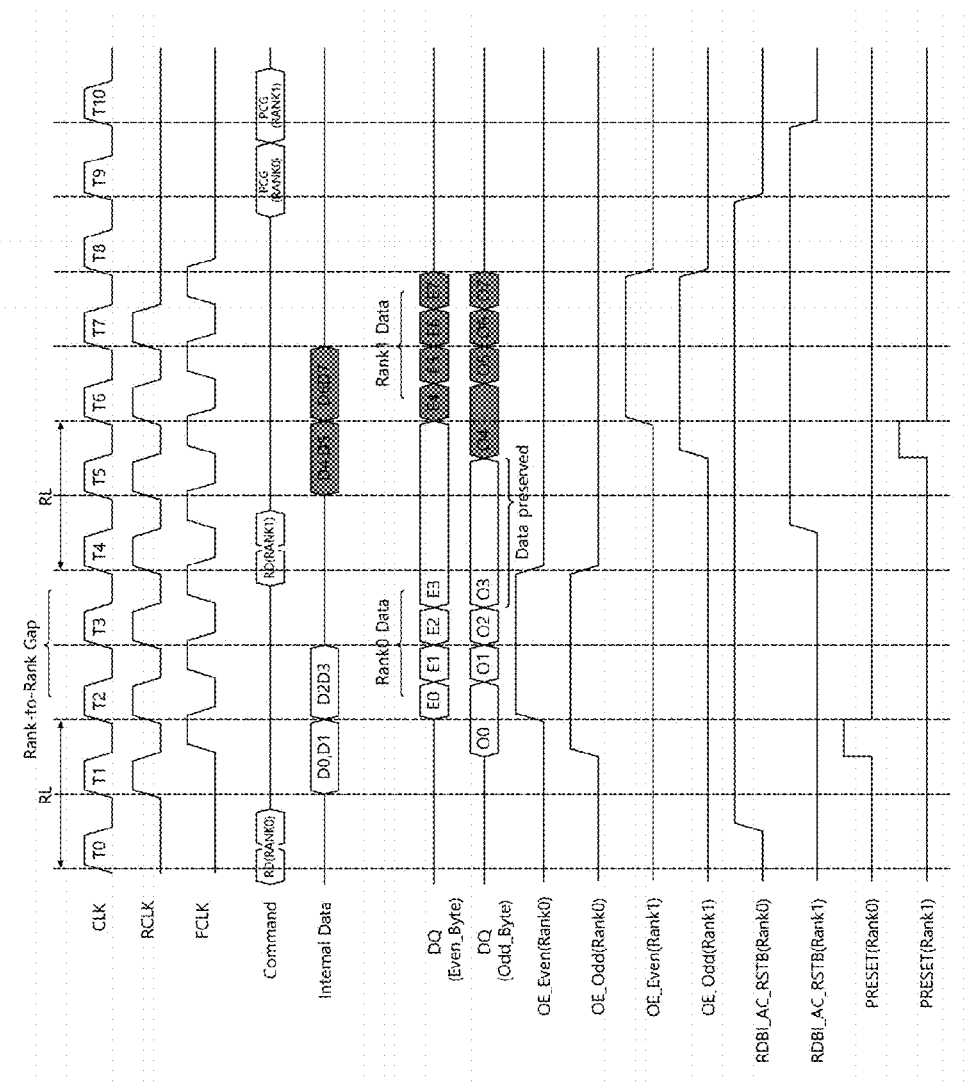
FIG. 9 is a timing diagram illustrating an example operation of the semiconductor apparatus according to an embodiment of the present disclosure.

FIG. 9 illustrates an example in which the read latency RL is set to 2tCK and the burst length BL is set to 4.

When a read command RD for the first rank RANK0 is input at a timing T0 based on a rising edge of the clock signal CLK, internal data D0 to D3 may be output according to the first and second synchronous clock signals RCLK and FCLK based on a timing T1.

At a timing earlier by a half clock than the preset read latency RL after the read command RD for the first rank RANK0 is input, the odd-numbered byte O0 corresponding to the earliest in order may be output through the data input/output pads DQ<8:15, 24:31> before the even-numbered byte E0 is output, according to the preset signal PRESET and the odd-numbered output enable signal OE_Odd.

The preset signal PRESET may be activated to a high level, during a period in which the DBI reset signal RDBI_AC_RSTB is at an inactive level (e.g., high level), the even-numbered output enable signal OE_Even is at an inactive level (e.g., low level), and the odd-numbered output enable signal OE_Odd is at an active level (e.g., high level).

The odd-numbered bytes O1 to O3 corresponding to the next orders may be output through the data input/output pads DQ<8:15, 24:31> at normal timings according to the first and second synchronous clock signals RCLK and FCLK and the odd-numbered output enable signal OE_Odd.

At a timing T2 corresponding to a timing when a latency time of the preset read latency RL has passed after an input of the read command RD for the first rank RANK0, the even-numbered bytes E0 to E3 may be sequentially output through the data input/output pads DQ<0:7, 16:23> according to the even-numbered output enable signal OE_Even and the first and second synchronous clock signals RCLK and FCLK.

When it is assumed that a predefined rank-to-rank gap is 2tCK, a read command RD for the second rank RANK1 may be input at a timing T4, and internal data D4 to D7 may be output according to the first and second synchronous clock signals RCLK and FCLK based on a timing T5.

Like the first rank RANK0, at a timing earlier by a half clock than the preset read latency RL after the read command RD for the second rank RANK1 is input, the odd-numbered byte O4 corresponding to the earliest order may be output through the data input/output pads DQ<8:15, 24:31> before the even-numbered byte E4 is output, according to the preset signal PRESET and the odd-numbered output enable signal OE_Odd.

The odd-numbered bytes O1 to O3 corresponding to the next in order may be output through the data input/output pads DQ<8:15, 24:31> at normal timings according to the first and second synchronous clock signals RCLK and FCLK and the odd-numbered output enable signal OE_Odd.

At a timing T6 corresponding to the preset read latency RL after the read command RD for the second rank RANK1 is input, the even-numbered bytes E4 to E7 may be sequentially output through the data input/output pads DQ<0:7, 16:23> according to the even-numbered output enable signal OE_Even and the first and second synchronous clock signals RCLK and FCLK.

When a precharge command PCG is input, the DBI reset signal RDBI_AC_RSTB may be deactivated.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising a plurality of dies, any one of the dies being set to a first rank and another of the dies being set to a second rank,
    wherein one or more of the first and second ranks are configured to output any one of an even-numbered byte and an odd-numbered byte through an input/output stage at a timing earlier than the other one, according to a read command,
    wherein input/output stages of the first rank are coupled to input/output stages of the second rank,
    wherein the first rank comprises a first input/output stage corresponding to the even-numbered byte and a second input/output stage corresponding to the odd-numbered byte,
    wherein the second rank comprises a first input/output stage corresponding to the even-numbered byte and a second input/output stage corresponding to the odd-numbered byte, and
    wherein the first input/output stage of the first rank is coupled to the first input/output stage of the second rank, and the second input/output stage of the first rank is coupled to the second input/output stage of the second rank.

2. The semiconductor apparatus according to claim 1, wherein the first input/output stage of the first rank further comprises even-numbered DBI (Data Bus Inversion) pads and the second input/output stage of the first rank further comprises odd-number DBI pads.

3. The semiconductor apparatus according to claim 1, wherein the first rank comprises:
    a cell array configured to output data according to a read command;
    a DBI (Data Bus Inversion) circuit configured to generate DBI data and DBI flags by performing a DBI operation on the data output from the cell array, and output the DBI data and the DBI flags;
    a first driver configured to drive an even-numbered byte among the DBI data to a first input/output stage at a first timing;
    a second driver configured to drive an odd-numbered byte among the DBI data to a second input/output stage at a second timing according to a preset signal; and
    a preset signal generation circuit configured to generate the preset signal according to a DBI reset signal for resetting the DBI circuit.

4. The semiconductor apparatus according to claim 3, wherein the second driver comprises:
    a first logic gate configured to receive data corresponding to a first synchronous clock signal among the DBI data;
    a second logic gate configured to receive data corresponding to a second synchronous clock signal among the DBI data;
    a latch configured to store output signals of the first and second logic gates; and
    a transmitter configured to drive the signal stored in the latch as the odd-numbered byte to the second input/output stage during an active period of an odd-numbered output enable signal.

5. The semiconductor apparatus according to claim 3, wherein the preset signal generation circuit performs a logical operation on an even-numbered output enable signal, an odd-numbered output enable signal, and the DBI reset signal, and outputs the operation result as the preset signal.

6. A semiconductor apparatus comprising first and second dies, input/output stages of the first die set to a first rank being coupled to input/output stages of the second die set to a second rank,
    wherein one or more of the first and second ranks are configured to sequentially output even-numbered bytes and odd-numbered bytes through the input/output stages according to a read command, and output any one of the even-numbered byte and the odd-numbered byte corresponding to the earliest in order among the even-numbered bytes and the odd-numbered bytes through the input/output stage at a timing earlier than the other one,
    wherein the first rank comprises a first input/output stage corresponding to the even-numbered byte and a second input/output stage corresponding to the odd-numbered byte,
    wherein the second rank comprises a first input/output stage corresponding to the even-numbered byte and a second input/output stage corresponding to the odd-numbered byte, and
    wherein the first input/output stage of the first rank is coupled to the first input/output stage of the second rank, and the second input/output stage of the first rank is coupled to the second input/output stage of the second rank.

7. The semiconductor apparatus according to claim 6, wherein the first input/output stage of the first rank further comprises even-numbered DBI (Data Bus Inversion) pads and the second input/output stage of the first rank further comprises odd-numbered DBI pads.

8. The semiconductor apparatus according to claim 6, wherein the first rank comprises:
    a cell array configured to output data according to a read command;
    a DBI (Data Bus Inversion) circuit configured to generate DBI data and DBI flags by performing a DBI operation on the data output from the cell array, output the DBI data and the DBI flags, and be reset according to a DBI reset signal;
    a first driver configured to drive an even-numbered byte among the DBI data to a first input/output stage at a first timing;
    a second driver configured to drive an odd-numbered byte among the DBI data to a second input/output stage at a timing earlier than the first timing, according to a preset signal; and
    a preset signal generation circuit configured to generate the preset signal according to the DBI reset signal.

9. The semiconductor apparatus according to claim 8, wherein the second driver comprises:
a first logic gate configured to receive data corresponding to a first synchronous clock signal among the DBI data;
a second logic gate configured to receive data corresponding to a second synchronous clock signal among the DBI data;
a latch configured to store output signals of the first and second logic gates; and
a transmitter configured to drive the signal stored in the latch as the odd-numbered byte to the second input/output stage during an active period of an odd-numbered output enable signal.

10. The semiconductor apparatus according to claim 8, wherein the preset signal generation circuit performs a logical operation on an even-numbered output enable signal, an odd-numbered output enable signal, and the DBI reset signal, and outputs the operation result as the preset signal.

11. The semiconductor apparatus according to claim 10, further comprising an output timing control circuit configured to generate the even-numbered output enable signal and the odd-numbered output enable signal, using internal shift signals generated by sequentially shifting a source signal based on a clock signal.

12. The semiconductor apparatus according to claim 11, wherein the output timing control circuit comprises:
a first flip-flop configured to temporarily store one of the internal shift signals according to the clock signal, and generate a first internal signal;
a second flip-flop configured to temporarily store the first internal signal according to the clock signal, and output the stored signal as the even-numbered output enable signal; and
a logic gate configured to perform an OR operation on the first internal signal and the even-numbered output enable signal and output the operation result as the odd-numbered output enable signal.

13. A semiconductor apparatus comprising:
a cell array configured to output data according to a read command;
a DBI (Data Bus Inversion) circuit configured to generate DBI data and DBI flags by performing a DBI operation on the data output from the cell array, output the DBI data and the DBI flags, and be reset according to a DBI reset signal;
a first driver configured to drive an even-numbered byte among the DBI data to a first input/output stage at a first timing;
a second driver configured to drive an odd-numbered byte among the DBI data to a second input/output stage at a timing earlier than the first timing, according to a preset signal; and
a preset signal generation circuit configured to generate the preset signal according to the DBI reset signal.

14. The semiconductor apparatus according to claim 13, wherein the second driver comprises:
a first logic gate configured to receive data corresponding to a first synchronous clock signal among the DBI data;
a second logic gate configured to receive data corresponding to a second synchronous clock signal among the DBI data;
a latch configured to store output signals of the first and second logic gates; and
a transmitter configured to drive the signal stored in the latch as the odd-numbered byte to the second input/output stage during an active period of an odd-numbered output enable signal.

15. The semiconductor apparatus according to claim 13, wherein the preset signal generation circuit performs a logical operation on an even-numbered output enable signal, an odd-numbered output enable signal, and the DBI reset signal, and outputs the operation result as the preset signal.

16. The semiconductor apparatus according to claim 13, further comprising an output timing control circuit configured to generate the even-numbered output enable signal and the odd-numbered output enable signal, using internal shift signals generated by sequentially shifting a source signal based on a clock signal.

17. The semiconductor apparatus according to claim 16, wherein the output timing control circuit comprises:
a first flip-flop configured to temporarily store one of the internal shift signals according to the clock signal, and generate a first internal signal;
a second flip-flop configured to temporarily store the first internal signal according to the clock signal, and output the stored signal as the even-numbered output enable signal; and
a logic gate configured to perform an OR operation on the first internal signal and the even-numbered output enable signal and output the operation result as the odd-numbered output enable signal.

* * * * *